United States Patent [19]
Ku et al.
[11] 3,925,106
[45] Dec. 9, 1975

[54] ION BOMBARDMENT METHOD OF PRODUCING INTEGRATED SEMICONDUCTOR CIRCUIT RESISTORS OF LOW TEMPERATURE COEFFICIENT OF RESISTANCE

[75] Inventors: San-Mei Ku; Burton J. Masters, both of Poughkeepsie, N.Y.
[73] Assignee: IBM Corporation, Armonk, N.Y.

[22] Filed: Dec. 26, 1973
[21] Appl. No.: 428,537

[52] U.S. Cl. .................. 148/1.5; 148/186
[51] Int. Cl. .................. H01l 7/44
[58] Field of Search .................. 148/1.5, 186, 187

[56] References Cited

UNITED STATES PATENTS

| | | | |
|---|---|---|---|
| 3,615,875 | 10/1971 | Morita | 148/1.5 |
| 3,736,192 | 5/1973 | Tokuyama | 148/1.5 |

*Primary Examiner*—Peter D. Rosenberg
*Attorney, Agent, or Firm*—J. B. Kraft

[57] ABSTRACT

A method for producing integrated circuit resistors of relatively high resistivity which are temperature stable, i.e., have a low temperature coefficient of resistance at operating temperatures. The resistor is formed in a selected region of an integrated circuit substrate through the introduction of appropriate dopant ions by standard ion implantation or diffusion techniques. However, the concentration of such introduced dopant ions is in excess of the concentration ordinarily required by such techniques. The region into which such dopant ions are introduced is subjected to a bombardment with non-dopant ions at a dose which is sufficient to damage the crystal structure of the region but insufficient to form an amorphous phase in this bombarded region; the bombardment may be carried out either before, after or, where appropriate, even simultaneously with the introduction of the dopant ions. As a result of this ion bombardment, the sheet resistance of the resistor region becomes substantially higher than the selected resistance despite the presence of excess dopant ions. Then, the substrate is heated at a temperature of from 500°C. to 800°C. for a time sufficient to partially anneal the damage so as to lower the sheet resistance of the region to the selected sheet resistance. The annealing time/temperature cycle is carried out so as to maintain the temperature coefficient of resistance below the temperature coefficient of resistance for conventional high resistivity resistors produced by ion implantation or diffusion.

15 Claims, 5 Drawing Figures

ION BOMBARDMENT METHOD OF PRODUCING INTEGRATED SEMICONDUCTOR CIRCUIT RESISTORS OF LOW TEMPERATURE COEFFICIENT OF RESISTANCE

BACKGROUND OF INVENTION

The present invention relates to the fabrication of integrated circuits and, more particularly, to the fabrication of resistors in integrated circuits having a high sheet resistivity and a very low temperature coefficient of resistance.

In bipolar monolithic integrated circuits, the resistors of the circuits are conventionally either fabricated simultaneously with the base diffusion or grown epitaxially. Traditionally, when such resistors were formed within the integrated circuit through the introduction of impurities, diffusion was the prevalent method of forming such resistors. In recent years, ion implantation has to some extent supplanted diffusion as an approach for introducing the dopant ions forming the resistor into the substrate. The art has recognized that ion implantation has several advantages when used in the fabrication of high resistivity resistors. One of the most practical advantages of ion implantation is its precise doping capability. In addition, ion implantation has the advantage of a more precise lateral control of doping levels. Thus, lateral reproducibility is easier to achieve. Similarly, the depth of vertical penetration in doping levels is also more easily controlled by the combination of controlling implant energy, the ion beam current density and the time of implantation. In addition, since ion implanted resistors can be processed at relatively low temperatures, i.e., postimplantation annealing temperatures rarely exceed 900°C., the danger of diffusion of other impurities of contaminants is minimized.

Despite these improvements in resistor fabrication resulting from ion implantation, ion implanted and diffused resistors still share one common problem. In high resistance resistors, i.e., resistors having a sheet resistivity greater than in order of 1K-ohms per square, temperature stability is less than a desirable level for many circuit applications. In such high resistivity resistors, the value of the temperature coefficient of resistance is undesirably high. Temperacoefficient of resistance or TCR is well known in the art and may be described as follows:

Temperature Coefficient of Resistance

If the resistiviity is defined as:

$$\rho = \frac{1}{ne\mu}$$

where $\mu$ is the mobility and e is the electronic charge, and n is the carrier concentration, then TCR can be defined as:

$$\frac{1}{\rho} \cdot \frac{d\rho}{dT}$$

which can also be expressed in terms of $$TCR = \frac{\alpha - E_a/kT}{T}$$

where $E_a$ is the dopant activation energy and $\alpha$ is the exponent of the mobility-temperature relation. In the temperature range of 300°–400°K, one can assume lattice scattering as the dominant scattering mechanism for Si. Then, $\mu = T^{-\alpha}$ where $\alpha \sim 2.3$ for *p* type and $\alpha \sim 2.6$ for *n* type Si. There are two adjustable variables in the above equation for minimizing the TCR, i.e, the $\alpha$ and $E_a$. In the device operating temperature range, changes of the slope of mobility vs T are generally small, thus the activation energy could be the dominant influence in affecting the TCR. In order to arrive at a TCR of 0, $E_a$ for p type should be ~0.059 eV and $E_a$ ~0.067 *e*V for *n* type.

The temperature coefficient of resistance TCR is always higher in high resistivity, lightly doped semiconductor regions than it is in the lower resistivity and more highly doped semiconductor regions. Thus, resistors of high resisitivity are more subject to the effects of temperature on their stability during operating conditions.

SUMMARY OF THE PRESENT INVENTION

Accordingly, it is a primary object of the present invention to provide a method for fabricating high resistivity integrated circuit resistors having a relatively low temperature coefficient of resistance.

It is another object of the present invention to provide a method involving ion bombardment for fabricating high resistivity resistors having a relatively low temperature coefficient of resistance.

It is a further object of the present invention to provide high resistivity ion implanted resistors having a relatively low temperature coefficient of resistance.

The present invention provides a method for forming a high resistivity resistor region having a selected sheet resistance and a substantially reduced temperature coefficient of resistance in an integrated circuit by the combination of introducing dopant ions into a region of a semiconductor substrate and additionally bombarding the region with non-dopant ions at a dose which is sufficient to damage the crystal structure but insufficient to form an amorphous phase in the bombarded region. The dopant ions may be introduced by conventional diffusion techniques but are preferably introduced by any standard ion implantation technique. Concentration of such introduced dopant ions must be in excess of the concentration required for the selected sheet resistance by any standard diffusion or ion implantation technique which would not involve the additional bombardment. The bombardment which may be conducted prior to, simultaneously with or subsequent to the introduction of the dopant ions, is preferably carried out using ions of an inert gas, such as helium, neon or argon, or by protons. Preferably, the non-dopant ions are of a material which will in no way affect the substrate. Since the substrate is silicon, silicon ions provide excellent nondopant ions for this purpose which in no way contaminate the substrate.

After the bombardment is completed, the resistance of the bombarded region will be substantially higher than the selected sheet resistance. This is believed to be due to the effect of the damage introduced by the ion bombardment on carrier concentration and mobility. The substrate is then heated, at a temperature from 500°C. to 800°C. for a time sufficient to partially anneal the damage. As the damage is removed by the annealing step, the sheet resistance of the region is continually lowered. The cycle is continued until the region reaches the selected sheet resistance. As well be hereinafter described, the particular time, temperature cycle may be readily selected so as to maintain a temperature coefficient of resistance below the temperature coefficient resistance of a standard equivalent diffused or ion implanted resistor region which is not subject to the bombardment.

Without being bound by the theory involved, it is believed that the unexpected effect of the present method in achieving a lowered temperature coefficient of resistance may be explained as follows. It appears that high resistivity resistors have temperature coefficients of resistance of relatively high value because such resistors have relatively low dopant ion concentrations and, consequently, because of such low concentrations, there is a greater carrier mobility variation when subject to changes in temperature. Reference is made to the text *Silicon Semiconductor Technology*, W. R. Runyan, pp. 166–168, McGraw-Hill. Accordingly, by the method of the present invention, carrier mobility is curtailed in two respects. First, as a result of the ion bombardment step and subsequent annealing step, a controlled amount of damage still remains in the crystalline structure. This damage interferes with and, consequently, lowers carrier mobility. In addition, because of the ability of the present method to introduce a controlled amount of damage into the resistor region, an excess amount of dopant ions beyond what would be conventionally required for a selected sheet resistance may be introduced. By the same controlled introduction of crystalline damage, the effect of such excess carriers upon sheet resistance is compensated for by the damage defects. On the other hand, the presence of controlled amounts of residual damage centers after annealing helps to reduce the temperature coefficient of resistance.

It should be noted, in the practice of the present invention, it is desirable to control the vertical boundaries of the resistor region being fabricated by controlling the bombardment with non-dopant ions so that the crystalline damage does not extend into the substrate to any degree substantially beyond the depth of the region of dopant ions. For best results, it is preferable that the region of damage created by the non-dopant ions be substantially coextensive in depth with the region of introduced dopant ions.

The foregoing and other objects, features and advantages of the invention will be apparent from the following more particular description and preferred embodiments of the invention as illustrated in the accompanying drawings.

DESCRIPTION OF THE PREFERRED EMBODIMENTS OF THE PRESENT INVENTION

Figure 1A:
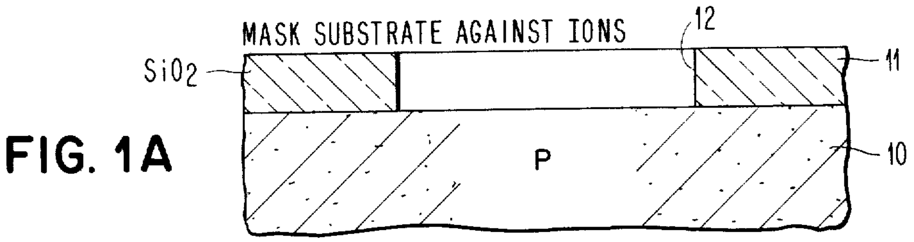
FIGS. 1A–1D are diagrammatic, partial sections of a portion of an integrated circuit at various fabrication stages indicated in the drawings as illustrative of the steps involved in the practice of the preferred embodiment of the present invention.

With reference to FIGS. 1A–1D, there will now be described a method for forming an N type resistor having a sheet resistance of 1.8K ohms per square with a minimal temperature coefficient of resistance in accordance with the present invention. Referring to FIG. 1A, utilizing conventional integrated circuit photolithographic fabrication and etching techniques, a silicon dioxide mask 11 having a thickness of 7,000A is formed on a P type silicon substrate 10 having a resistivity of 10 ohm-cm. Mask 11 has an opening 12 through which the N type resistor will be formed by ion implantation.

Figure 1B:
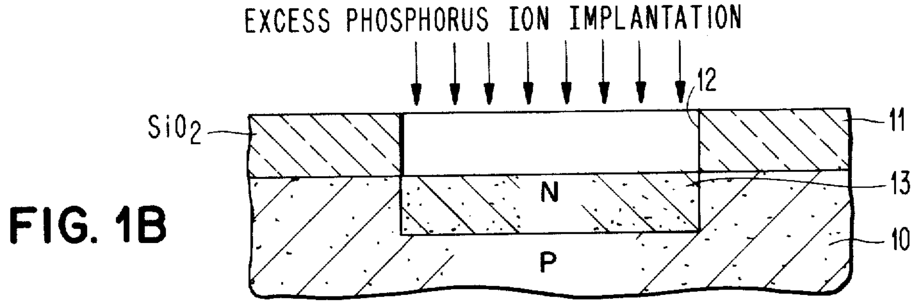

Next, as illustrated in FIG. 1B, phosphorous ions ($31_{P+}$) are introduced through opening 12 into the substrate by conventional ion implantation equipment operating at an energy level of 175KeV with a phosphorous dosage level of $5 \times 10^{12}cm^{-2}$. This dosage level is in the order of twice the conventional dosage level that one would use under the above-described conditions in order to achieve the selected sheet resistance 1.8K ohms per square in a conventional ion implantation without the subsequent bombardment step in accordance with the present invention. The ion implantation is conducted at approximately room temperature. N type resistor region 13 is formed as a result of this ion implantation.

Figure 1C:
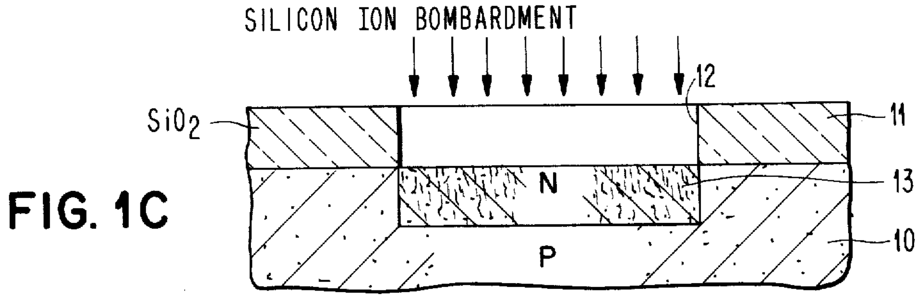
Figure 1D:
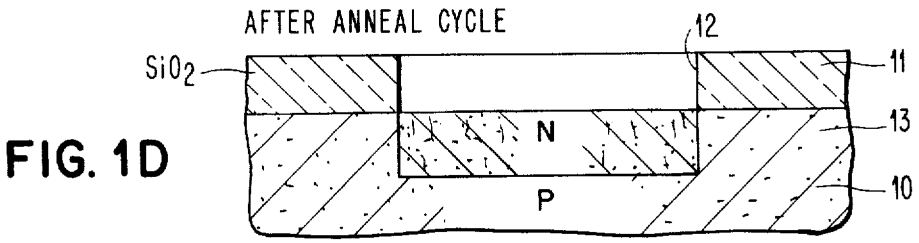

Next, as shown in FIG. 1C, resistor region 15 is subject to a bombardment with a non-dopant ion which is, in the present procedure, silicon ($28_{Si+}$). The bombardment may be conducted on the same ion equipment at an energy level of 300KeV. The dosage of the silicon ion is $1 \times 10^{14}cm^{-2}$. The bombardment is conducted at room temperature. Instead of silicon, other non-contaminating ions may be used as non-dopant ions, including such ions as neon, argon, nitrogen, hydrogen, or helium.

The bombardment dosage is selected so that the damage created is insufficient to render region 13 amorphous. In this connection, reference is made to FIG. 2 which is a graph showing the various dosage levels of the ions of various elements which will render a bombarded region amorphous. This graph is based on data which is well known and understood in the art. For example, U.S. Pat. No. 3,736,192 describes the dosages required for the bombardment of various elements in order to render a bombarded substrate amorphous. In the graph in FIG. 2, the mass number of a particular element will determine the dosage level which will render a bombarded substrate amorphous, i.e., the greater the mass number of the element, the lower the dosage required.

Figure 2:
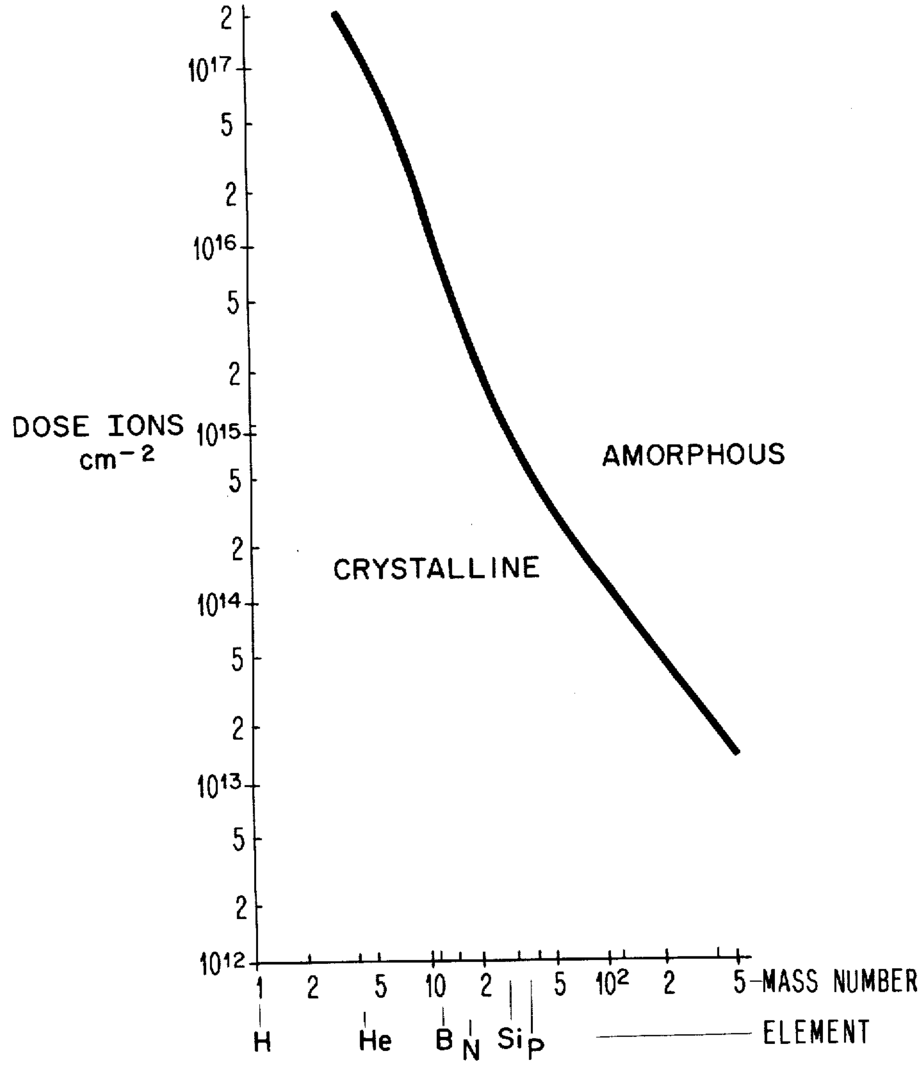
FIG. 2 is a graph showing the limits of dosages of particular elements which, when used in the bombardment step, damage the crystal to an extent which is still insufficient to render the bombarded substrate amorphous; dosages to the left of the graph line are insufficient to create the amorphous phase while dosages to the right of the line will create an amorphous phase.

Accordingly, the selected dosage must be such that it is sufficient to introduce damage into the crystalline structure but insufficient to render it amorphous; the dosage level must be to the left of the line in the graph of FIG. 2. It should be noted that the above-described silicon dosage level used in the present procedure lies to the left of the line in the graph. Because of the relatively low dosage level of the previously implanted phosphorous ions, whatever attendant damage such phosphorous ions could introduce appears to have little effect in comparison to the damage introduced by the silicon ions which have a dosage about two orders of magnitude greater than that of the phosphorous. Thus, even if the attendant damage caused by the introduction of the phosphorous ions is taken into account, it would merely raise the total dosage from 1.00 to 1.05 × $10^{14}cm^{-2}$ which is still clearly to the left of the line on the graph.

At this stage in the procedure, as a result of the bombardment with the silicon ions, the sheet resistance of region 13 is greatly increased, several orders of magnitude above the selected sheet resistance of 1.8K-ohms per square. In addition, the value of the temperature coefficient of resistance is of a relatively high value. The temperature coefficient of resistance is determined in the conventional manner known in the art and previously described.

Next, the structure will be subjected to an anneal cycle at a temperature between 500°C. and 800°C. for a time sufficient to lower the high sheet resistance to the selected sheet resistance of 1.8K ohms-per square. The particular temperature selected will be such that when the selected sheet resistance is achieved, the temperature coefficient of resistance will be minimal. In the present example, we found that by annealing at 600°C. for thirty minutes in an inert atmosphere, it was possible to achieve a sheet resistance of 1.8K-ohms per square for resistor 13 with a minimum temperature coefficient of resistance in the order of 400 ppm/°C.

The selection of the particular temperature time cycle within the range described above, which achieves the selected sheet resistance for a resistor with a minimum temperature coefficient of resistance, may be carried out as follows. A sample of an implanted and bombarded resistor is heated at an initial temperature, let us say 550°C., for a period of time until the sheet resistance is lowered to the selected sheet resistance, which in this case is 1.8K ohms per square. At this point, the temperature coefficient of resistance of the sample is determined. If the value of temperature coefficient of resistance is undesirably high but negative, the annealing procedure is repeated with another sample except that a higher annealing temperature, e.g., 700°C., is selected. The reason for raising the temperature with a high negative coefficient of resistance value is that before annealing, the ion bombarded resistor will have a very high negative value temperature coefficient of resistance. Thus, if after annealing, temperature coefficient of resistance value is still too high and negative, the anneal temperature is probably too low.

On the other hand, if after an anneal cycle to produce the selected sheet resistance, the temperature coefficient of resistance is too high and positive, this is an indication that the temperature selected was too high. Then, on another sample, the procedure is repeated with an anneal cycle using a lower temperature. In the example described, if on the initial anneal at 550°C., the resulting temperature coefficient of resistance was too high but negative and if at 700°C. anneal cycle, the temperature coefficient of resistance was too high but positive, the optimum temperature for achieving a minimum temperature coefficient of resistance will lie between 550°C. and 700°C. By a simple repetition of this procedure, it will be possible to hone in on an optimum anneal cycle temperature for achieving a minimal temperature coefficient of resistance. This may involve perhaps three or four iterations. In the present example, of course, the optimum temperature turns out to be 600°C.

The above-described procedure may, by way of an additional illustration, be utilized for the implantation of a P type resistor region into an N type substrate. Utilizing the above-described structure, conditions and equipment, the previously described procedure is repeated with the following exception: an N type substrate of about the same resistivity is used in place of the P type substrate; the P type dopant used for the initial implantation is boron ($11_{B+}$), implanted at an energy level of 150KeV and a dose of 1 × $10^{13}cm^{-2}$ and silicon bombardment at 400KeV and dose of 1 × $10^{15}cm^{-2}$; the optimum anneal cycle subsequent to the silicon bombardment in order to achieve a sheet resistance of 1.8K-ohms per square and a minimum temperature coefficient of resistance for the P type boron doped resistor is 750°C. for 30 minutes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for forming a high resistivity region of a selected sheet resistance and a reduced temperature coefficient of resistance in an integrated circuit comprising introducing dopant ions into a region of a semiconductor substrate, and additionally bombarding the region with non-dopant ions at a dose which is sufficient to damage the crystal structure but insufficient to form an amorphous phase in the bombarded region, the concentration of the introduced dopant ions being in excess of the concentration required for said selected sheet resistance in an umbombarded region, but said bombardment producing a resistance higher than the selected resistance, and heating at a temperature of from 500°C. to 800°C. for a time sufficient to partially anneal the damage so as to lower the sheet resistance of the region to the selected sheet resistance while the temperature coefficient of resistance is maintained below the temperature coefficient of resistance of said unbombarded region.

2. The method of claim 1 wherein said dopant ions are introduced by diffusion.

3. The method of claim 1 wherein said dopant ions are introduced by ion implantation.

4. The method of claim 2 wherein the diffusion of dopant ions precedes said bombardment.

5. The method of claim 3 wherein said ion implantation of dopant ions precedes said bombardment.

6. The method of claim 2 wherein both said non-dopant ions and said semiconductor substrate are silicon.

7. The method of claim 5 wherein both said non-dopant ions and said semiconductor substrate are silicon.

8. A method for forming a high resistivity region of a selected sheet resistance and a reduced temperature coefficient of resistance in an integrated circuit comprising introducing dopant ions into a region of a semiconductor substrate, and additionally bombarding the region with non-dopant ions at a dose which is sufficient to damage the crystal structure but insufficient to form an amorphous phase in the bombarded region, said dose being insufficient to damage the structure of substrate substantially beyond the depth of said region of dopant ions, the concentration of the introduced dopant ions being in excess of the concentration required for said selected sheet resistance in an unbombarded region, but said bombardment producing a resistance higher than the selected resistance, and heating to partially anneal the damage to the point that the sheet resistance of said region is lowered to the selected resistance while the temperature coefficient of resistance is maintained below the temperature coeffficient of resistance of said ion bombarded region.

9. The method of claim 8 wherein said dopant ions are introduced by diffusion.

10. The method of claim 8 wherein said dopant ions are introduced by ion implantation.

11. The method of claim 9 wherein the diffusion of dopant ions precedes said bombardment.

12. The method of claim 10 wherein said ion implantation of dopant ions precedes said bombardment.

13. The method of claim 9 wherein both said nondopant ions and said semiconductor substrate are silicon.

14. The method of claim 12 wherein both said nondopant ions and said semiconductor substrate are silicon.

15. The method of claim 8 wherein said damage is substantially coextensive with the distribution of dopant ions in said substrate.

* * * * *